US010860408B2

(12) United States Patent
Bowling et al.

(10) Patent No.: US 10,860,408 B2
(45) Date of Patent: Dec. 8, 2020

(54) INTEGRITY MONITOR PERIPHERAL FOR MICROCONTROLLER AND PROCESSOR INPUT/OUTPUT PINS

(71) Applicant: Microchip Technology Incorporated, Chandler, AZ (US)

(72) Inventors: Stephen Bowling, Chandler, AZ (US); Igor Wojewoda, Tempe, AZ (US); Manivannan Balu, Bangalore (IN)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 191 days.

(21) Appl. No.: 15/970,159

(22) Filed: May 3, 2018

(65) Prior Publication Data

US 2019/0340047 A1    Nov. 7, 2019

(51) Int. Cl.
G06F 11/00 (2006.01)
G06F 11/07 (2006.01)
G06F 13/40 (2006.01)

(52) U.S. Cl.
CPC ........ G06F 11/079 (2013.01); G06F 11/0745 (2013.01); G06F 13/409 (2013.01)

(58) Field of Classification Search
CPC .. G06F 11/079; G06F 13/409; G06F 11/0745; G01R 31/2853; G01R 31/66; G01R 31/31717
USPC ......................................................... 714/45
See application file for complete search history.

(56) References Cited

U.S. PATENT DOCUMENTS

| 9,432,298 | B1* | 8/2016 | Smith ................ H04L 49/9057 |
| 2006/0194353 | A1* | 8/2006 | Spuhler ................ G01R 31/048 438/14 |
| 2009/0073625 | A1* | 3/2009 | Botti ....................... H01L 23/50 361/91.1 |
| 2012/0001642 | A1 | 1/2012 | Sylvester et al. ............. 324/538 |
| 2014/0111243 | A1* | 4/2014 | Kumar Goel ...... G01R 31/2601 324/762.02 |

FOREIGN PATENT DOCUMENTS

JP    2001296330 A    10/2001    ............ G01R 31/02

OTHER PUBLICATIONS

Microchip Technology Incorporated, "Section 8. Reset," dsPIC33/PIC24E Family Reference Manual, 16 pages, Aug. 4, 2010.
Microchip Technology Incorporated, "Section 10. I/O Ports," dsPIC33/PIC24E Family Reference Manual, 24 pages, Nov. 29, 2012.
International Search Report and Written Opinion, Application No. PCT/US2019/029784, 15 pages, dated Aug. 7, 2019.

* cited by examiner

Primary Examiner — Yair Leibovich
(74) Attorney, Agent, or Firm — Slayden Grubert Beard PLLC

(57) ABSTRACT

A semiconductor die includes a feedback path coupled to the output pin, and an integrity monitor circuit (IMC). The output pin is communicatively coupled to the logic. The IMC is configured to receive a data value. The IMC is further configured to receive measured data value from the output pin routed through the feedback path, compare the data value and the measured data value, and, based on the comparison, determine whether an error has occurred.

18 Claims, 3 Drawing Sheets

INTEGRITY MONITOR PERIPHERAL FOR MICROCONTROLLER AND PROCESSOR INPUT/OUTPUT PINS

FIELD OF THE INVENTION

The present disclosure relates to management of input and output (I/O) of processors and microcontrollers and, more particularly, to integrity monitor peripheral for microcontroller and processor input/output pins.

BACKGROUND

Microcontrollers, processors, and other semiconductor devices are built from a die of semiconductor material and placed into other elements so that they may interface with and work within electronic devices and systems. For example, a semiconductor device may include a platter on which the semiconductor device rests, within a lead frame. The lead frame may include metal structures inside a chip package that carry signals from the die to the outside. The semiconductor device may be mounted onto a printed circuit board (PCB) that mechanically supports and electrically connects electronic components or electrical components using conductive tracks, pads and other features. Components are generally soldered onto the PCB to both electrically connect and mechanically fasten them to it.

I/O pins may connect the semiconductor device to the outside world, such as on the PCB. The pins may be routed to particular portions of the semiconductor device. The routing may be dynamic such that a particular pin might be used in different ways at different times, depending upon the instant configuration of the electronic device.

Processors, microcontrollers, microcontroller units (MCU), central processing units (CPU), and other electronic devices may include internal peripherals. These peripherals may include digital or analog circuitry that is available for various parts of the MCU to perform tasks. Such internal peripherals may include, for example, counters, timers, a real-time clock, universal asynchronous receiver-transmitter (UART) interfaces, serial peripheral interfaces (SPI), or I2C interfaces.

SUMMARY

A semiconductor die may include logic configured to generate a data value and an output pin configured to output values from the semiconductor die. The output pin may be communicatively coupled to the logic. The semiconductor die may include a first feedback path communicatively coupled to the output pin and an integrity monitor circuit (IMC). The IMC may be configured to receive a data value from the logic and a first measured data value from the output pin routed through the first feedback path, compare the data value and the first measured data value, and, based on the comparison of the data value and the first measured data value, determine whether an error has occurred. In combination with any of the above embodiments, the comparison may be based upon an XOR operation. In combination with any of the above embodiments, the comparison yields an indication that an error has occurred. In combination with any of the above embodiments, the IMC is further configured to ignore the indication that the error has occurred based upon timing of an expected response. In combination with any of the above embodiments, the IMC is further configured determine, based on the comparison of the data value and the first measured data value, that the error has occurred within the semiconductor die between the logic and the output pin. In combination with any of the above embodiments, the semiconductor die further includes a second feedback path communicatively coupled to the output pin through a semiconductor package pin and to the IMC. In combination with any of the above embodiments, the IMC may be further configured to receive a second measured data value from the output pin routed through the second feedback path, compare the data value and the second measured data value, and, based on the comparison of the data value and the second measured data value, determine that an error has occurred between the semiconductor die and the semiconductor package. In combination with any of the above embodiments, the IMC may be further configured to determine that a bond wire failure has occurred between the semiconductor die and the semiconductor package based on the comparison of the data value and the second measured data value. In combination with any of the above embodiments, the IMC is further configured to determine that an error has occurred outside the semiconductor die based on the comparison of the data value and the first measured data value. In combination with any of the above embodiments, the semiconductor may include a third feedback path communicatively coupled to the output pin through an external integrated circuit pin and to the IMC. In combination with any of the above embodiments, the IMC may be further configured to receive a third measured data value from the output pin routed through the third feedback path. In combination with any of the above embodiments, the semiconductor device may be configured to compare the value and the third measured data value. In combination with any of the above embodiments, the IMC may be configured to, based on the comparison of the data value and the third measured data value, determine that an error has occurred between the semiconductor package or output pin and the external integrated circuit pin.

Embodiments of the present disclosure may include an integrated circuit device. The integrated circuit device may include any of the semiconductor dies described above. The integrated circuit device may be implemented as, for example, a microcontroller, application-specific integrated circuit (ASIC), field-programmable gate array (FPGA), microprocessor, system-on-a-chip, or other suitable electronic device. In combination with any of these embodiments, the integrated circuit may include a semiconductor package that includes the semiconductor die.

Embodiments of the present disclosure may include methods performed by any of the semiconductor dies or integrated circuits described above.

DETAILED DESCRIPTION

Figure 1:
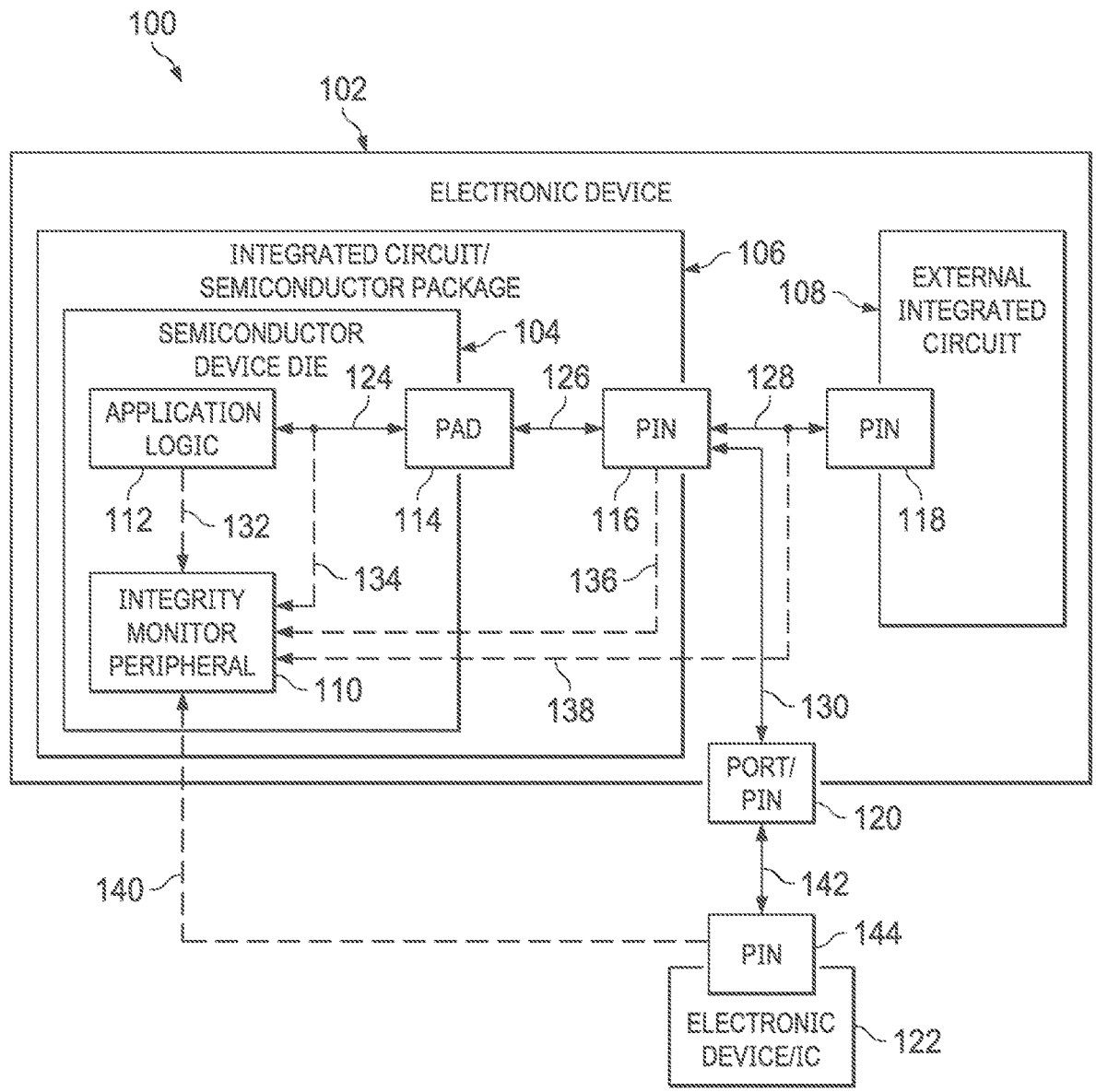
FIG. 1 illustrates a system utilizing an integrity monitor peripheral, according to embodiments of the present disclosure.

FIG. 1 is an illustration of a system 100 utilizing an integrity monitor peripheral, according to embodiments of the present disclosure. The integrity monitor peripheral (IMP) may be implemented by analog circuitry, digital circuitry, instructions for execution by a processor, or any suitable combination thereof. The IMP may be configured to determine whether errors have occurred in the propagation of a data signal between I/O pins, pads, or other physical interfaces of various levels of system 100. The IMP may be implemented by, for example, IMP 110.

IMP 110 may be implemented in any suitable location of system 100. In one embodiment, IMP 110 may be implemented within a source of data signals for which IMP 110 is configured to verify. For example, IMP 110 may be implemented within a semiconductor device die 104 that includes application logic 112 configured to generate data signals for which IMP 110 is configured to verify. In other embodiments, IMP 110 may be located within any suitable portion of an electronic device 102, such as within an integrated circuit or semiconductor package. The integrated circuit or semiconductor package that includes IMP 110 may be a same or different integrated circuit or semiconductor package that includes application logic 112. In still other embodiments, IMP 110 may be located within another semiconductor die but within the same integrated circuit or package that includes application logic 112.

System 100 may include one or more electronic devices, such as electronic device 102. System 100 may also include other integrated circuits or electronic devices external to electronic device 102, such as electronic device/integrated circuit 122. System 100 may be configured to route information to and from these elements. For example, electronic device 102 and electronic device/integrated circuit 122 may route information to and from each other through respective port/pin 120 and pin 144. Port/pin 120 and pin 144 may be connected via a path 142. Path 142 may include, for example, a trace, wire, bond, optical connection, wireless connection, or any other suitable interconnect.

A given electronic device 102 may include various integrated circuits. For example, electronic device 102 may include an integrated circuit or semiconductor package 106. Moreover, electronic device 102 may include another integrated circuit 108. Integrated circuit 108 may be external to the integrated circuit housing application logic 112. Electronic device 102 may be configured to route information to and from such integrated circuits. Each given integrated circuit may be configured to perform various functionalities. Such functionality may be defined by respective application logic, such as application logic 112, alone or in combination with analog circuitry, digital circuitry, instructions for execution by a processor, or any suitable combination thereof. A given integrated circuit may implement, for example, a processor, microcontroller, MCU, CPU, application-specific integrated circuit (ASIC), field-programmable gate array, or other device. Electronic device 102 may be configured to route signals between integrated circuit or semiconductor package 106 and integrated circuit 108 via a path 128. Furthermore, electronic device 102 may be configured to route signals from an integrated circuit, such as integrated circuit or semiconductor package 106, and port/pin 120 for communication external to electronic device 102 via a path 130. Paths 128, 130 may each include, for example, a trace, wire, bond, optical connection, wireless connection, or any other suitable interconnect. Integrated circuit or semiconductor package 106 may include one or more I/O pins, such as pin 116. Integrated circuit 108 may include one or more I/O pins, such as pin 118. Path 128 may connect between pin 116 and pin 118.

A given integrated circuit, such as integrated circuit or semiconductor package 106, may include one or more semiconductor device dice, such as semiconductor device die 104. Integrated circuit or semiconductor package 106 may be configured to route information between contents of semiconductor device die 104, other semiconductor device die within integrated circuit or semiconductor package 106, and elements external to integrated circuit or semiconductor package 106. Integrated circuit or semiconductor package 106 may be configured to route such information via a path 126. Path 126 may include a down bond, die bond, or other suitable interconnect. Path 126 may be formed between a pad 114 of semiconductor device die 104 and pin 116.

To implement some or all of the functionality of integrated circuit or semiconductor package 106, application logic 112 may be cast in semiconductor device die 104. Application logic 112 may be implemented by any suitable combination of analog or digital circuitry. Application logic 112 may be connected to pad 114 through semiconductor-based path 124. Path 124 may include any suitable interconnect internal to semiconductor device die 104, such as a physical, electrical, or electromagnetic interconnect. Data generated by or data delivered to application logic 112 may be routed through any suitable number and kind of physical interfaces, such as pad 114 located at the edge of semiconductor device die 104, pin 116 located on integrated circuit or semiconductor package 106, pin 118 located at the edge of integrated circuit 108, port/pin 120 located at the edge of electronic device 102, and pin 144 of electronic device/integrated circuit 122. Moreover, such data may be routed through paths 124, 126, 128, 130, 142. Although a particular number and kind of interconnects are shown in the figures, any suitable number and kind of interconnections may be used.

System 100 may include feedback paths for routing signal information to IMP 110. System 100 may include any suitable number and kind of feedback paths to route signal information to IMP 110. Feedback paths in system 100 may include paths 132, 134, 136, 138, 140. The particular implementation of paths 132, 134, 136, 138, 140 may depend upon where IMP 110 is implemented within system 100. For example, paths 132, 134, 136, 138, 140 may require additional pins, pads, ports, or other interconnects (not shown). Data sent from application logic 112 to other portions of system 100 may be separately routed back to IMP 110 through ports 132, 134, 136, 138, 140. Application logic 112 may generate data and send it on path 124 to pad 114. The data as originally generated may also be sent to IMP 110 through path 132. The data as-arrived at pad 114 may be sent to IMO 110 through path 134. The data provided to pad 114 may be provided to pin 116 through path 126. The data as-arrived at pin 116 may also be sent to IMP 110 through path 136. The data provided to pin 116 may be provided to pin 118. The data as-arrived at pin 118 may also be sent to IMP 110 through path 138. Data may also be sent to port/pin 120 and on to pin 144. The data as-arrived at pin 144 may also be sent to IMP 110 through path 140. Other feedback paths may also exist, such as a path (not shown) between port/pin 120 and AMP 110.

In one embodiment, IMP 110 may be configured to check data that was to be provided to the interconnections against data that was actually received at such interconnections. Data that was provided to the interconnections may be determined by data received on path 132 from application logic 112. IMP 110 may be configured to check data from one or more such interconnections, or any suitable combination thereof. If data that was actually received at such interconnections, and rerouted to IMP 110 though paths 132, 134, 136, 138, 140, does not match the data that was expected (that is, the original data or data that was sent to such interconnections), then IMP 110 may generate an interrupt, trap, reset, or otherwise provide messaging that an error has occurred. IMP 110 may be configured to determine at which interconnection, or between which interconnections, an error occurred. The error may result from a signal break, mechanical fault, short, short circuit, open circuit, faulty signal conditioning, external tampering, or other error. Although paths are shown as connecting elements directly in FIG. 1, paths may pass through intermediate circuitry, integrated circuits, or chips. Nevertheless, the paths represent data that should remain consistent even if such intermediate elements are traversed. For example, the signal arriving at pin 118 or traversing back from pin 118 may have passed through one or more external integrated circuits and circuit elements along the way. However, such a signal should be, if no errors have occurred, the same signal that originated at application logic 112 and pad 114.

Accordingly, IMP 110 may be configured to identify mechanical faults on printed circuit boards (PCB) that could cause a loss of signal integrity or loss of control in an application. Examples of errors may include a cracked PCB trace, short circuit, or a broken solder connection to an IC pin. As functional safety requirements increase, integrated circuits or electronic devices of system 100 may be used in automotive, appliance, or other applications controlling motors, burners, and other external devices that could cause injury if not properly controlled. IMP 110 may be configured to provide any element in which it is implemented, such as a microcontroller, direct and immediate feedback that a control signal has reliably reached its destination or that such a control signal has failed. By monitoring within system 100, IMP 110 may act faster than other detection methods such as monitoring of external voltages and currents.

IMP 110 may be implemented in any suitable manner to determine whether output pins or pads include values match expected input data. In one embodiment, IMP 110 may be configured to apply an XOR operation to detect mismatches. Furthermore, delay may occur between the time that expected values generated by application logic 112 are available and the time that values arrive from pins or pads at IMP 110. Accordingly, for a given location of a pin or pad, a particular, configurable delay may be applied by IMP 110 before making a comparison. The delay may be a blanking delay. If IMP 110 is to evaluate multiple pins or pads, IMP 110 may include a multiplexer to select the particular pin or pad to evaluate at a given moment in time. Moreover, given the ability to evaluate multiple pins or pads, IMP 110 may be configured to evaluate a configurable number of these channels. IMP 110 may be configured to evaluate particular channels through, for example, an instruction or register value.

IMP 110 may be implemented as a core-independent peripheral (CIP). In a system such as a microcontroller or processor, IMP, as a CIP, may function in an ongoing manner that is independent of the microcontroller or processor. While software executing on the microcontroller or processor may read or write data to registers accessible to IMP 110, and IMP 110 may generate interrupts to software executing on the microcontroller or processor, IMP 110 does not depend upon the execution state of such software to perform the monitoring tasks described in the present disclosure. Upon determination of an error, IMP 110 may generate interrupts to such software, or set flags or register values that are read by such software. IMP 110 may be enabled by register values that are set by such software. However, once running, IMP 110 might not need execution of any given software to continue monitoring. Moreover, IMP 110 might set flags, register values, or generate interrupts, but does not require synchronous handling of such values in software to continue operating. Moreover, IMP 110 might monitor particular feedback paths from particular pins of pad 114, pin 116, pin 118, pin 144 as identified in configuration registers or other settings. System 100 may include many such pins, and the particular pins to be monitored may be designated in such configuration registers.

Because IMP 110 operates in a manner independent of processor cores, IMP 110 may operate while the larger microcontroller or processor is in a sleep, idle, or other suspended mode. The priority of interrupts generated by IMP 110 may be configurable. If an interrupt generated by IMP 110 is of an appropriate priority (that is, a sufficiently high priority), the interrupt may cause the processor core to wake.

IMP 110 may perform its monitoring at any suitable time. IMP 110 may be configured to perform such monitoring continuously, continuously for a duration of time, periodically, or on-demand.

Figure 2:
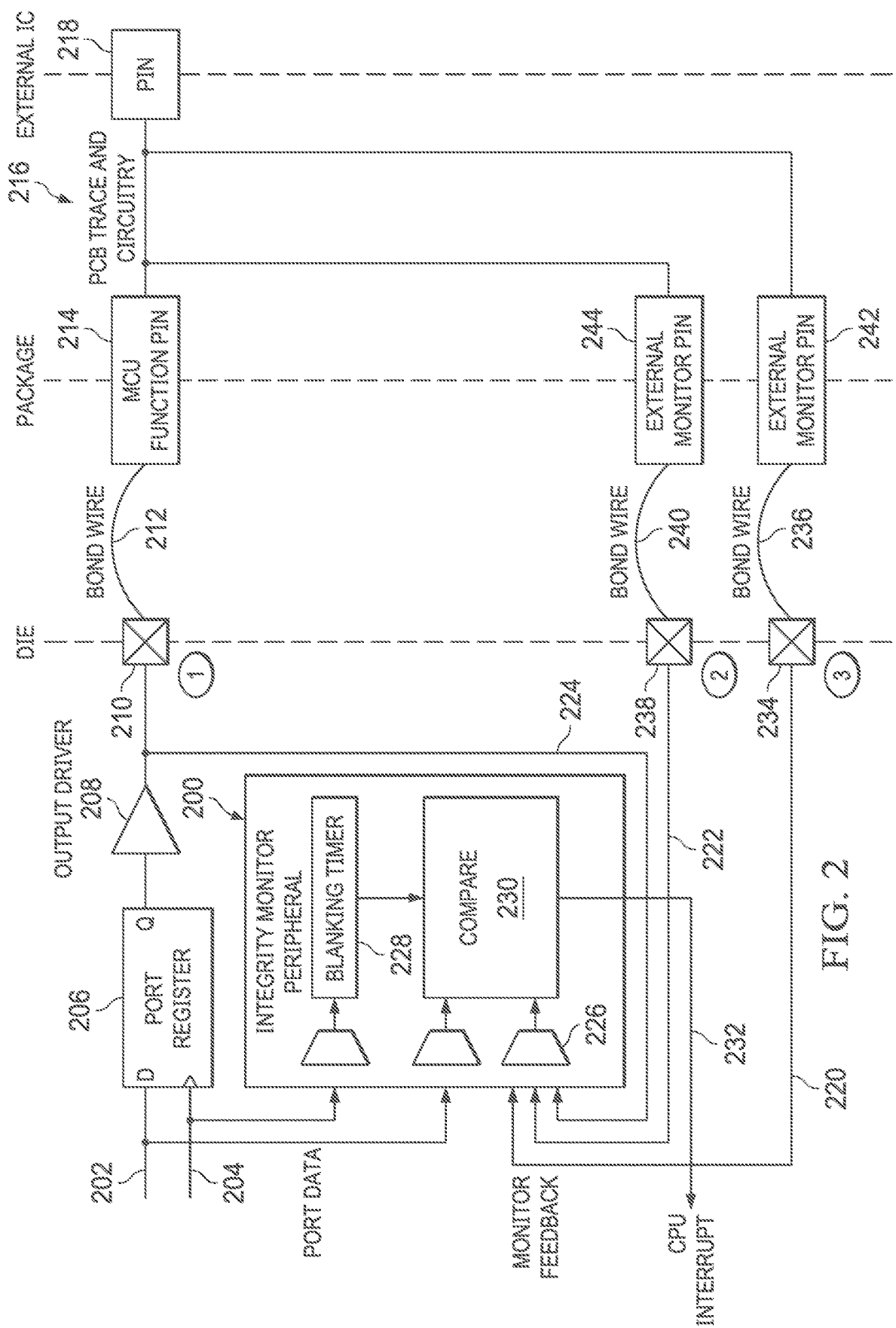
FIG. 2 illustrates a more detailed view of an integrity monitor peripheral, according to embodiments of the present disclosure.

FIG. 2 illustrates a more detailed view of an integrity monitor peripheral 200, according to embodiments of the present disclosure. IMP 200 may fully or partially implement IMP 110 of FIG. 1.

IMP 200 may include inputs for a clock signal 204 and a data input 202. Data input 202 may be generated by application logic 112 or other portions of the portion of system 100 in which IMP 200 resides. Data input 202 may be stored in a PORT or output register 206. IMP 200 may include one or more multiplexers 226 configured to select which of data feedback lines 220, 222, 224 are to be compared against stored data. IMP 200 may include a blanking timer 228 configured to delay or otherwise appropriately time a comparison of stored data with a selected one of data feedback lines 220, 222, 224. IMP 200 may include any suitable compare circuitry 230 configured to compare a selected one of data feedback lines 220, 222, 224 against expected data received from input data 202, adjusted for delay. For example, IMP 200 may include a bit-wise or byteiwise XOR logical function. If the XOR is true, then the values between actual and expected data may be different and an interrupt 232 may be generated. After checking one of a selected one of data feedback lines 220, 222, 224 against expected data received from input data 202, a next selected one of data feedback data lines 220, 222, 224 may be compared. IMP 200 may apply this comparison for many different channels in parallel. Data may be stored as needed.

Input data 202 may be received from any suitable source. In one embodiment, input data 202 may be received from application logic 124 that may be implemented within the same semiconductor die that implements IMP 200. In another embodiment, input data 202 may be received from an element external to the semiconductor die that implements IMP 200. For example, input data 202 may be received from elements on other integrated circuits, electronic devices, or semiconductor die.

After input data 202 is stored in a port register 206, and output via an output driver 208, it may arrive at other portions of system 100. FIG. 2 illustrates example application of IMP 100 to data provided to and routed back from pad 114, pin 116, and pin 118. Additional elements (not shown) may be included in various implementations to, for example, apply IMP 100 to port/pin 120, pin 144, and path 142.

After input data 202 is stored in a port register 206, and output via an output driver 208, it may arrive at a pad 210. Pad 210 may implement pad 114. Pad 210 may be located at the edge of a semiconductor die such as semiconductor device die 104. To make a connection on a pin 214 at a near edge of semiconductor packaging, a bond wire 212 may be used. Pin 214 may implement pin 116. Pin 214 may be, for example, a microcontroller unit function pin. Bond wire 212 may implement path 126. The semiconductor packaging may implement integrated circuit or semiconductor package 106. Pin 214 may implement an external pin for an integrated circuit. The data may be routed through PCB trace and circuitry to another pin 218. Pin 218 may implement pin 118 of integrated circuit 108, which may be external to the integrated circuit or packaging that hosts application logic 112 or IMP 200. The PCB trace and circuitry may implement path 128.

Any suitable number of feedback lines may be routed back to IMP 200 from along this described path. In one embodiment, a feedback line 224 may be routed back from pad 210 to IMP 200, shown as (1) in FIG. 2. Feedback line 224 may implement path 134. This feedback may provide information about whether or not data has correctly arrived at the edge of the semiconductor die. In another embodiment, a feedback line 222 may be routed back from pin 214 to IMP 200, shown as (2) in FIG. 2. Feedback line 222 may implement path 136. This feedback may provide information about whether or not data has correctly arrived across bond wire 212 to the pin of the integrated circuit or semiconductor package. In the example of FIG. 2, this feedback may be routed back across pin 244 to pad 238. Another bond wire 240 may be used to make such a connection. The feedback may be routed internally within semiconductor packaging between pins 214, 244, or externally between pins 214, 244. In yet another embodiment, a feedback line 220 may be routed back from pin 218 to IMP 200, shown as (3) in FIG. 2. Feedback line 220 may implement path 138. This feedback may provide information about whether or not data has correctly arrived across a PCB board or other connection between integrated circuits to pin 218, as it is routed back across pin 242 to pad 234. Another bond wire 236 may be used to make such a connection.

Accordingly, an error reported at 214 but not at 210 may indicate that the error specifically occurred between pad 210 and pin 214, likely in bond wire 212. Furthermore, an error reported at 218 but not at 214 may indicate that the error specifically occurred between pin 218 and pin 214, likely in the PCB trace and circuitry 216.

In addition, particular patterns of errors may be evaluated. For example, instead of a simple error found by XOR comparison, a particular cycle of values or length of XOR results may be evaluated. This may be performed through detection blanking. Moreover, detection blanking may take into account propagation delay as the input data arrives at the various measuring points and back to IMP 200. The propagation delay may also depend upon pad drive strength, slew rate, pad loading, and external signal conditioning and buffers.

Figure 3:
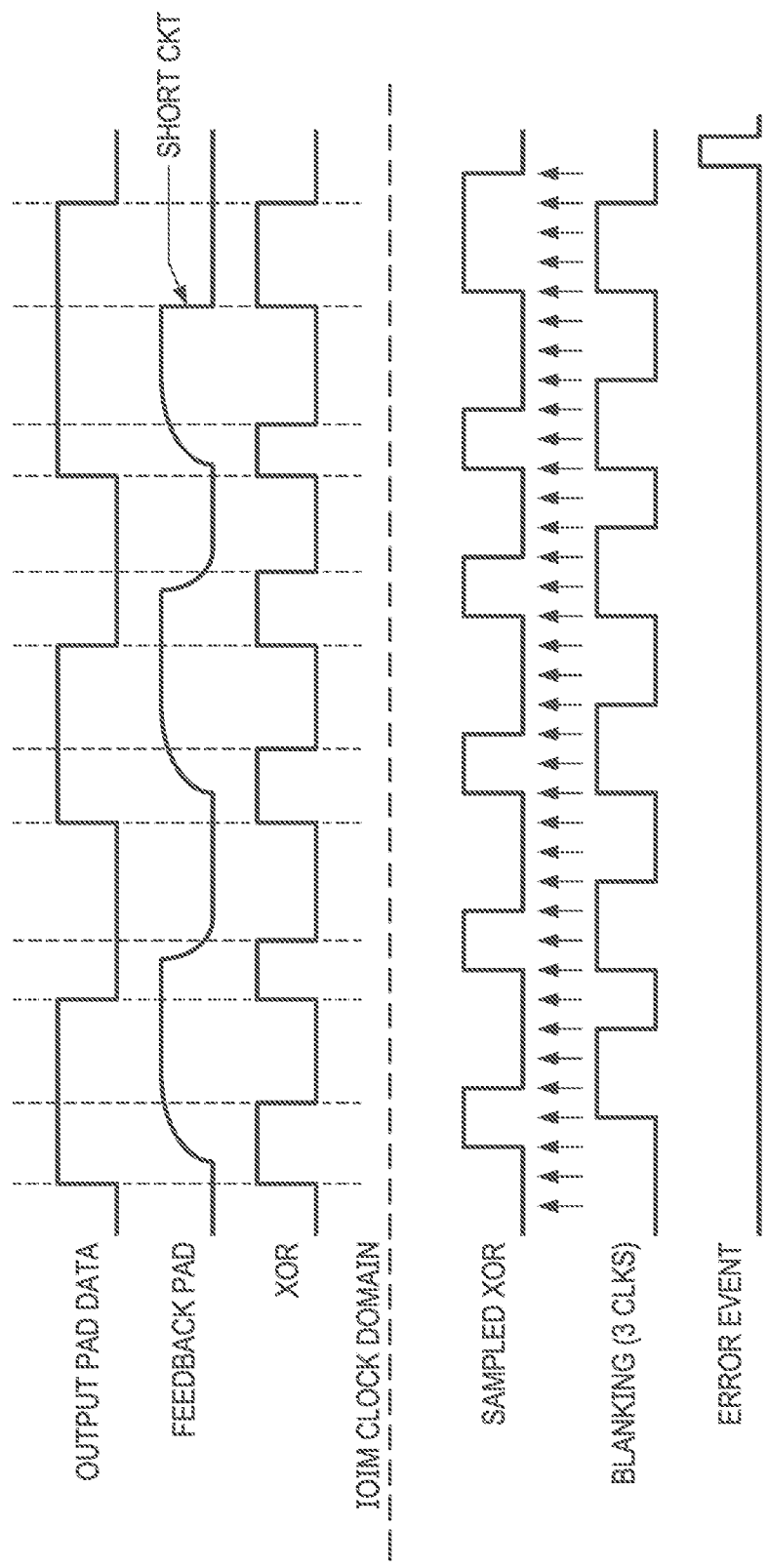
FIG. 3 illustrates an example timing diagram of an integrity monitor peripheral, according to embodiments of the present disclosure.

FIG. 3 is an example illustration of a timing diagram of IMP 200, according to embodiments of the present disclosure.

Output pad data may reflect data that is sent to any of the pads or pins in examples (1), (2), or (3) in FIG. 2. Feedback pad may reflect data that is returned from the pad or pin in these examples. The feedback pad may exhibit rise and fall times that are not ideal due to a variety of conditions, such as filtering, load, noise, or other conditions.

The xor plot may show an example result of comparison using XOR operation, but without any delays applied. A false-positive error might otherwise be generated if blanking delays were not applied. The xor plot shows that XOR of the comparison of the monitor feedback and of the data that was sent generates a high signal periodically. However, this may be suppressed using the blanking delays.

In the bottom half of FIG. 3, a time domain of IMP 200 may be shown. Upon receipt of an XOR result that is positive, the result may be suppressed, or blanked, for a specified number of cycles. The specified number of cycles may be determined empirically, and may depend upon the particular pad or pin being evaluated, as some such pads or pins may have different slew rates, noise, loads, or other factors affecting the shape of feedback pad. For example, the blanking delay may be three clock cycles. Thus, an error event is not generated until an actual short circuit is encountered, unexpectedly dropping the feedback pad value to zero when a continual "1" value is expected. After three cycles of this, the error event may be generated. During the blanking delays, the result of the XOR operation may be simply ignored.

The present disclosure has been described in terms of one or more embodiments, and it should be appreciated that many equivalents, alternatives, variations, and modifications, aside from those expressly stated, are possible and within the scope of the disclosure. While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein.

The invention claimed is:

1. A semiconductor die, comprising:
   an output pin;
   a first feedback path communicatively coupled to the output pin;
   an integrity monitor circuit (IMC) configured to:
      receive a data value;
      receive a first measured data value through the first feedback path;
      compare the data value and the first measured data value; and
      based on the comparison of the data value and the first measured data value, determine whether an error has occurred;
   a second feedback path communicatively coupled to the output pin through a semiconductor package pin and to the IMC;
   wherein the IMC is further configured to:
      receive a second measured data value from the output pin routed through the second feedback path;
      compare the data value and the second measured data value; and
      based on the comparison of the data value and the second measured data value, determine that an error has occurred between the semiconductor die and a semiconductor package including the semiconductor die.

2. The semiconductor die of claim 1, further comprising a logic to generate the data value, wherein:
   the output pin is configured to output values from the semiconductor die, the output pin communicatively coupled to the logic; and
   the data value is received from the logic.

3. The semiconductor die of claim 1, wherein:
the comparison yields an indication that an error has occurred; and
the IMC is further configured to ignore the indication that the error has occurred based upon timing of an expected response.

4. The semiconductor die of claim 1, wherein the IMC is further configured determine, based on the comparison of the data value and the first measured data value, that the error has occurred within the semiconductor die between logic that generated the data value and the output pin.

5. The semiconductor die of claim 1, wherein the IMC is further configured to determine that a bond wire failure has occurred between the semiconductor die and the semiconductor package based on the comparison of the data value and the second measured data value.

6. The semiconductor die of claim 1, wherein the IMC is further configured to determine that an error has occurred outside the semiconductor die based on the comparison of the data value and the first measured data value.

7. A semiconductor die, comprising:
an output pin;
a first feedback path communicatively coupled to the output pin;
an integrity monitor circuit (IMC) configured to:
receive a data value;
receive a first measured data value through the first feedback path;
compare the data value and the first measured data value; and
based on the comparison of the data value and the first measured data value,
determine whether an error has occurred;
a second feedback path communicatively coupled to the output pin through a semiconductor package pin and to the IMC; and
a third feedback path communicatively coupled to the output pin through an external integrated circuit pin and to the IMC;
wherein the IMC is further configured to:
receive a second measured data value from the output pin routed through the second feedback path;
compare the data value and the second measured data value;
based on the comparison of the data value and the second measured data value, determine that an error has occurred between the semiconductor die and the semiconductor package;
receive a third measured data value from the output pin routed through the third feedback path;
compare the data value and the third measured data value; and
based on the comparison of the data value and the third measured data value, determine that an error has occurred between the semiconductor package and the external integrated circuit pin.

8. An integrated circuit device, comprising:
a semiconductor die;
a semiconductor output pin;
a first feedback path communicatively coupled to the semiconductor output pin;
an integrity monitor circuit (IMC) configured to:
receive a data value;
receive a first measured data value from the semiconductor output pin routed through the first feedback path;
compare the data value and the first measured data value; and
based on the comparison of the data value and the first measured data value, determine whether an error has occurred;
a semiconductor package including a semiconductor package pin and the semiconductor die;
a second feedback path communicatively coupled to the semiconductor output pin through a semiconductor package pin and to the IMC;
wherein the IMC is further configured to:
receive a second measured data value routed through the second feedback path;
compare the data value and the second measured data value; and
based on the comparison of the data value and the second measured data value, determine that an error has occurred between the semiconductor die and the semiconductor package.

9. The integrated circuit device of claim 8, further comprising:
a logic configured to generate the data value; and
a semiconductor output pin configured to output values from the semiconductor die, the semiconductor output pin communicatively coupled to the logic.

10. The integrated circuit device of claim 8, wherein:
the comparison yields an indication that an error has occurred; and
the IMC is further configured to ignore the indication that the error has occurred based upon timing of an expected response.

11. The integrated circuit device of claim 8, wherein the IMC is further configured determine, based on the comparison of the data value and the first measured data value, that the error has occurred within the semiconductor die between logic that generated the data value and the semiconductor output pin.

12. The integrated circuit device of claim 8, wherein the IMC is further configured to determine that a bond wire failure has occurred between the semiconductor die and the semiconductor package based on the comparison of the data value and the second measured data value.

13. The integrated circuit device of claim 8, wherein the IMC is further configured to determine that an error has occurred outside the semiconductor die based on the comparison of the data value and the first measured data value.

14. An integrated circuit device, comprising:
a semiconductor die;
a first feedback path communicatively coupled to a semiconductor output pin;
an integrity monitor circuit (IMC) configured to:
receive a data value;
receive a first measured data value from the semiconductor output pin routed through the first feedback path;
compare the data value and the first measured data value; and
based on the comparison of the data value and the first measured data value, determine whether an error has occurred;
a semiconductor package including a semiconductor package pin and the semiconductor die;
a second feedback path communicatively coupled to the semiconductor output pin through a semiconductor package pin and to the IMC; and a third feedback path communicatively coupled to the semiconductor output pin through an external integrated circuit pin and to the IMC;
wherein the IMC is further configured to:
receive a second measured data value routed through the second feedback path;
compare the data value and the second measured data value;
based on the comparison of the second data value and the second measured data value, determine that an error has occurred between the semiconductor die and the semiconductor package;
receive a third measured data value routed through the third feedback path;
compare the data value and the third measured data value; and
based on the comparison of the data value and the third measured data value, determine that an error has occurred between the semiconductor package and the external integrated circuit pin.

15. A method of testing, by an integrity monitor circuit within a semiconductor die, pathways in a system, comprising:
including a first feedback path communicatively coupled to a semiconductor output pin;
including a second feedback path communicatively coupled to the semiconductor output pin through a semiconductor package output pin;
receiving a data value;
monitoring the first feedback path;
receiving the data value and a first measured data value routed through the first feedback path;
comparing the data value and the first measured data value;
based on the comparison of the data value and the first measured data value; determining whether an error has occurred;
monitoring the second feedback path;
receiving a second measured data value routed through the second feedback path;
comparing the data value and the second measured data value; and
based on the comparison of the data value and the second measured data value, determining that an error has occurred between the semiconductor die and the semiconductor package including the semiconductor die.

16. The method of claim 15, further comprising:
determining, from the comparison, an indication that an error has occurred; and
ignoring the indication that the error has occurred based upon timing of an expected response.

17. The method of claim 16, further comprising:
monitoring a third feedback path communicatively coupled to the semiconductor output pin through an external integrated circuit pin;
receiving a third measured data value routed through the third feedback path;
comparing the data value and the third measured data value; and
based on the comparison of the data value and the third measured data value, determining that an error has occurred between the semiconductor package and the external integrated circuit pin.

18. A method of testing, by an integrity monitor circuit within a semiconductor die pathways in a system, comprising:
including, in a semiconductor package, a semiconductor package pin and the semiconductor die;
receiving a data value;
monitoring a first feedback path communicatively coupled to a semiconductor output pin;
receiving the data value and a first measured data value routed through the first feedback path;
comparing the data value and the first measured data value;
based on the comparison of the data value and the first measured data value, determining whether an error has occurred;
monitoring a second feedback path communicatively coupled to the semiconductor output pin through a semiconductor package pin;
monitoring a third feedback path communicatively coupled to the semiconductor output pin through an external integrated circuit pin;
receiving a second measured data value routed through the second feedback path;
comparing the data value and the second measured data value;
based on the comparison of a second data value and the second measured data value, determining that an error has occurred between the semiconductor die and the semiconductor package;
receiving a third measured data value routed through the third feedback path;
comparing the data value and the third measured data value; and
based on the comparison of the data value and the third measured data value, determine that an error has occurred between the semiconductor package and the external integrated circuit pin.

* * * * *